(12) United States Patent  
Tang et al.

(10) Patent No.: US 9,179,557 B2  
(45) Date of Patent: Nov. 3, 2015

(54) TOUCH SCREEN AND METHOD OF PRODUCING THE SAME

(71) Applicant: SHENZHEN O-FILM TECH CO., LTD, Shenzhen (CN)

(72) Inventors: Genchu Tang, Shenzhen (CN); Shengcai Dong, Shenzhen (CN); Wei Liu, Shenzhen (CN); Bin Tang, Shenzhen (CN)

(73) Assignee: Shenzhen O-film Tech Co., Ltd., Guangdong (CN)

( * ) Notice: Subject to any disclaimer, the term of this patent is extended or adjusted under 35 U.S.C. 154(b) by 195 days.

(21) Appl. No.: 13/968,378

(22) Filed: Aug. 15, 2013

(65) Prior Publication Data

US 2014/0290980 A1  Oct. 2, 2014

Related U.S. Application Data

(63) Continuation of application No. PCT/CN2013/079207, filed on Jul. 11, 2013.

(30) Foreign Application Priority Data

Mar. 30, 2013  (CN) .......................... 2013 1 0110315

(51) Int. Cl.  
*H05K 1/02*  (2006.01)  
*H05K 3/46*  (2006.01)  
*G06F 3/044*  (2006.01)

(52) U.S. Cl.  
CPC ................ *H05K 3/465* (2013.01); *G06F 3/044* (2013.01); *H05K 1/0289* (2013.01);

(Continued)

(58) Field of Classification Search  
CPC .............. G02F 1/13338; G06F 3/0202; G06F 2203/04103; G06F 3/044; G06F 3/0412  
See application file for complete search history.

(56) References Cited

U.S. PATENT DOCUMENTS

2008/0165158 A1* 7/2008 Hotelling et al. ............. 345/174  
2008/0309633 A1* 12/2008 Hotelling et al. ............. 345/173

(Continued)

FOREIGN PATENT DOCUMENTS

| CN | 102375627 A | 3/2012 |
|---|---|---|
| CN | 102903423 A | 1/2013 |

(Continued)

OTHER PUBLICATIONS

Chinese International Search Report and Written Opinion of corresponding International PCT Application No. PCT/CN2013/079207, dated Jan. 2, 2014.

(Continued)

*Primary Examiner* — Priyank Shah  
(74) *Attorney, Agent, or Firm* — J.C. Patents

(57) ABSTRACT

A touch screen comprises a glass substrate, a first conductive layer, an insulating adhesive layer and a second conductive layer. The first conductive layer is directly formed on the glass substrate and comprises first conductive pattern areas; the insulating adhesive layer is attached to the glass substrate, and one side of the insulating adhesive layer close to the glass substrate forms a first groove; the first conductive pattern area is received in the first groove and insulated from each other; one side of the insulating adhesive layer away from the glass substrate, is provided with a second groove; and the second conductive layer is received in the second groove, thus forming a plurality of second conductive pattern areas insulated with each other. The first conductive layer is directly formed on the glass substrate and made of a metal material, thus omitting an adhesive layer and saving the cost.

9 Claims, 6 Drawing Sheets

(52) U.S. Cl.
CPC ............... *G06F 2203/04103* (2013.01); *G06F 2203/04112* (2013.01); *H05K 3/4605* (2013.01); *H05K 2201/09681* (2013.01); *H05K 2203/0108* (2013.01)

(56) References Cited

U.S. PATENT DOCUMENTS

| | | | | |
|---|---|---|---|---|
| 2009/0315856 | A1* | 12/2009 | Oikawa et al. | 345/174 |
| 2012/0098782 | A1* | 4/2012 | Nam | 345/174 |
| 2012/0313887 | A1 | 12/2012 | Chen et al. | 345/174 |
| 2013/0047428 | A1 | 2/2013 | Ra | 29/846 |
| 2013/0278546 | A1* | 10/2013 | Kim et al. | 345/174 |
| 2013/0299222 | A1* | 11/2013 | Lee et al. | 174/258 |
| 2013/0307565 | A1* | 11/2013 | Ra et al. | 324/649 |
| 2014/0098307 | A1* | 4/2014 | Iwami | 349/12 |
| 2014/0152917 | A1* | 6/2014 | Lee et al. | 349/12 |

FOREIGN PATENT DOCUMENTS

| | | | | |
|---|---|---|---|---|
| CN | 102968202 | A | 3/2013 | |
| CN | 203178790 | U | 9/2013 | |
| JP | WO/2013/008827 | * | 1/2013 | ............. G06F 3/041 |

OTHER PUBLICATIONS

Chinese First Examination Report of corresponding China Application No. 201310110315.7, dated Nov. 27, 2013.

* cited by examiner

TOUCH SCREEN AND METHOD OF PRODUCING THE SAME

CROSS-REFERENCE TO RELATED APPLICATIONS

This application is a continuation of International Application No. PCT/CN2013/079207, filed on Jul. 11, 2013, which claims priority to Chinese Patent Application No. 201310110315.7, filed on Mar. 30, 2013, both of which are hereby incorporated by reference in their entireties.

FIELD OF THE TECHNOLOGY

The invention relates to the field of electronic equipment, particularly to a touch screen and a method of producing the same.

BACKGROUND

A touch screen is an inductive type device which may receive input signals such as touch and so on. The touch screen gives a new appearance of information interaction and is a new compelling device for information interaction. The development of the touch screen technology has attracted extensive attention of information media circles at home and abroad and has become an emerging sunrise hi-tech in the optoelectronic industry.

A conductive layer is a vital component of a touch screen. Currently, the conductive layer of the touch screen is formed on an insulating base material mainly with ITO (Indium Tin Oxide) through processes of vacuum plating, patterning and etching. The conductive layer is attached to a transparent glass panel through an adhesive layer, thus forming the touch screen.

Indium is very expensive and belongs to scarce resources, thus causing ITO to be costly. In additions, the process, where the entire surface of the insulating base material is plated with ITO and then a graphic etching process is carried out to the ITO, will waste a large quantity of ITO. This undoubtedly greatly increases the production cost. Furthermore, as the conductive layer formed on the insulating base material is attached to the glass panel through the adhesive layer, which not only adds a bonding process causing the production process to be complex and lengthy, but also increase the probability of poor product.

SUMMARY

Therefore, the invention provides a touch screen and a method of producing the same, in order to solve problems of complex production processes and relatively high cost.

A touch screen comprises:

a glass substrate, comprising a first surface and a second surface arranged opposite to the first surface, where the first surface is attached with a first conductive layer; the first conductive layer comprises a plurality of first conductive pattern areas; each of the first conductive pattern area comprises a metal grid consisting of a plurality of crossed metal wires; the first conductive pattern area is a metal plating layer attached to the first surface of the glass substrate through graphical etching; and the plurality of the first conductive pattern areas are insulated from each other;

an insulating adhesive layer, attached on the first surface, wherein a first groove, matched with the first conductive pattern area, is formed on one side of the insulating adhesive layer close to the first surface; the first conductive pattern area is received in the first groove; one side of the insulating adhesive layer far away from the first surface, is provided with a second groove with a preset shape; and the second groove is formed through graphical imprinting; and a second conductive layer, comprising a plurality of second conductive pattern areas, wherein the second conductive pattern area comprises a conductive grid consisting of a plurality of crossed conductive wires; the conductive material filled in the second groove is cured and forms the conductive grid of the second conductive pattern area; and the plurality of the second conductive pattern areas are insulated from each other;

wherein, a projection of the first conductive pattern area, which is projected on the surface of the second conductive pattern area, is intersected with the second conductive pattern area.

In one embodiment, the thickness of the second conductive layer is not larger than the depth of the second groove.

In one embodiment, a depth to width ratio of the second groove is larger than 1. In one embodiment, the insulating adhesive layer comprises a first insulating adhesive layer and a second insulating adhesive layer in sequence along a direction away from the first surface. The first groove is formed on one side of the first insulating adhesive layer close to the first surface, and the second groove is provided on one side of the second insulating adhesive layer, far away from the first surface.

In one embodiment, the touch screen also comprises a first lead wire and a second lead wire, wherein the first lead wire is attached to the first surface; one end of the first lead wire is electrically connected with the first conductive pattern area; the second lead wire is embedded in one side of the insulating adhesive layer, which is far away from the glass substrate; one end of the second lead wire is electrically connected with the second conductive pattern area; the other end of the first insulating adhesive layer is provided with a cutout at a portion thereof which aligns with the other end of the first lead wire; the other end of the first lead wire and the other end of the second leading wire are exposed to the same side of the second insulating adhesive layer through the cutout.

In one embodiment, the thickness of a grid wire of the metal grid of the first conductive pattern area is within a range of 10-50 nm.

In one embodiment, a metal wire of the first conductive pattern area is a transparent wire, and the light transmittance of the first conductive pattern area is more than 80%.

In one embodiment, the width of the grid wire of the metal grid of the second conductive pattern area is within a range of 500 nm-5 μm.

In one embodiment, the glass substrate is made of soda-lime glass or aluminosilicate glass.

A method of producing a touch screen, comprising the following steps:

providing a glass substrate, wherein the glass substrate comprises a first surface and a second surface which are arranged oppositely;

forming a first conductive layer, wherein the first conductive layer is directly formed on the first surface and has a plurality of first conductive pattern areas; the first conductive pattern area comprises a metal grid consisting of a plurality of crossed metal wires; and the plurality of the first conductive pattern areas are insulated from each other;

coating the insulating adhesive layer on the first surface, wherein the insulating adhesive layer is coated on the first surface, a first groove, matched with the first conductive pattern area, is formed on one side of the insulating adhesive layer close to the first surface; and the first conductive pattern area is received in the first groove;

imprinting a second groove, wherein the second groove is imprinted in one side of the insulating adhesive layer with a preset shape, the one side is far away from the first surface;

forming a second conductive layer, wherein a conductive material is filled in the second groove and cured, thus forming a second conductive layer with a plurality of second conductive pattern areas; the second conductive pattern area comprises a conductive grid formed by a conductive wire; the conductive grid is received in the second groove; the plurality of the second conductive pattern areas are insulated from each other; and a projection of the first conductive pattern area, which is projected on the surface of the second conductive pattern area, is intersected with the second conductive pattern area.

In one embodiment, forming the first conductive layer specifically comprises:

plating, wherein a conductive metal plating layer is formed on the first surface of the glass substrate through electroless plating, electroplating, vacuum sputtering or evaporation;

coating a photoresist, wherein the photoresist is coated on the surface of the metal plating layer; exposing and developing, wherein the photoresist is exposed and developed to facilitate a photoresist layer to form a plurality of the first conductive pattern areas;

etching, wherein the exposed part of the metal plating layer except the first conductive pattern area is hence eliminated to form the first conductive layer with a plurality of the first conductive pattern areas; the first conductive pattern area comprises a metal grid consisting of a plurality of crossed metal wires; and the plurality of the first conductive pattern areas are insulated from each other.

In one embodiment, coating the insulating adhesive layer comprises the following steps:

coating a first insulating adhesive layer, wherein the first groove, matched with the first conductive pattern area, is formed on one side of the first insulating adhesive layer close to the first surface; and the first conductive pattern area is received in the first groove;

curing the first insulating adhesive layer; and coating a second insulating adhesive layer.

In one embodiment, the glass substrate is made of soda-lime glass or aluminosilicate glass.

In the touch screen and the method of producing the same, the first conductive layer of the touch screen is directly formed on the surface of the glass substrate, and the first conductive layer adopts a common metal material with good conductivity, thus not only reducing the cost but also simplifying production processes. The first conductive layer and the second conductive layer adopt different molding methods respectively. By utilizing a better plating performance of the glass substrate, the first conductive layer is directly plated on the glass substrate, thus forming a transparent first conductive layer. The second conductive layer forms the second groove by imprinting, and then is filled with the conductive material and does not need to have etching, thus saving a large quantity of the conductive material. Therefore, the invention not only has a simple operation and a low cost but also may guarantee the touch screen to have a relatively low sheet resistance, a relatively high light transmittance, a relatively small thickness, etc.

DETAILED DESCRIPTION

Figure 1:
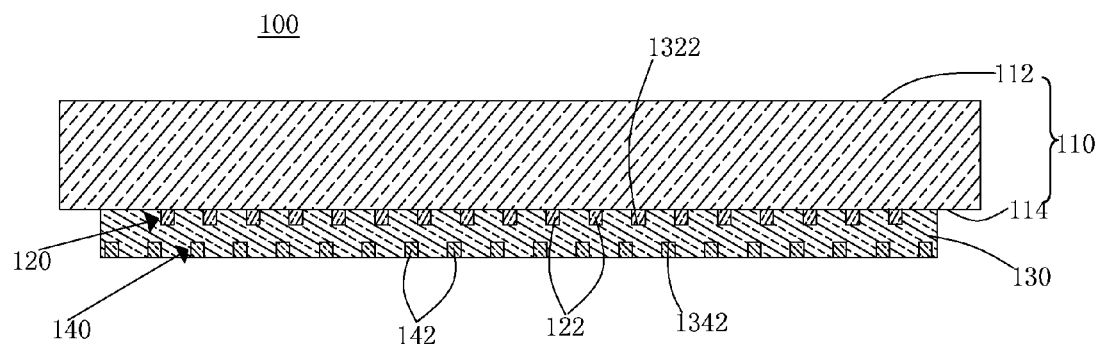
FIG. 1 is a schematic structural diagram of a touch screen.

With reference to the accompanying drawings and embodiments, the invention is further described in the followings:

See FIG. 1, a touch screen 100 includes a glass substrate 110, a first conductive layer 120, an insulating adhesive layer 130 and a second conducive layer 140. The glass substrate 110 includes a first surface 112 and a second surface 114. The first surface 112 and the second surface 114 are oppositely arranged. A metal plating layer is formed through electroless plating, electroplating, vacuum sputtering or evaporation. The metal plating layer is then patterned through etching to obtain the first conductive layer 120 directly attached to the surface of the glass substrate 110. The first conductive layer 120 includes a plurality of the first conductive pattern areas 122. The first conductive pattern area 122 includes a metal grid consisting of a plurality of crossed metal wires. A plurality of the first conductive pattern areas 122 are insulated from each other. The insulating adhesive layer 130 is attached to the first surface 112, and one side of the insulating adhesive layer 130 close to the first surface 112 forms a first groove 1322 matched with the first conductive pattern area 122. The first conductive pattern area 122 is received in the first groove 1322. The first groove 1322 enables a plurality of the first conductive pattern areas 122 to be insulated from each other. One side of the insulating adhesive layer 130, which is far away from the first surface 112, is provided with a plurality of second grooves 1342 with a preset shape. The second conductive layer 140 includes a plurality of second conductive pattern areas 142. The second conductive pattern areas 142 are received in the first grooves 1342 respectively. The second conductive pattern area 142 includes a conductive grid consisting of a plurality of crossed conductive wires. The plurality of the second conductive pattern areas 142 are insulated from each other. A projection of the first conductive pattern area 122, which is projected on the surface of the second conductive pattern area 142, is intersected with the second conductive pattern area 142.

In the above touch screen 100, the metal material is directly plated on the first surface 112 of the glass substrate, and directly forms the first conductive layer 120 on one side of the glass substrate 110 by utilizing a relatively good plating performance of the glass substrate 110, thus omitting an adhesive layer, simplifying production process, lowing cost and obtaining well-controlled yield. Meanwhile, the touch screen may be guaranteed to have relatively low sheet resistance, a relatively high light transmittance and a relatively small thickness.

In this embodiment, the glass substrate 110 may be an inorganic glass panel, for example, a soda-lime glass panel or an aluminosilicate glass panel. As the inorganic glass has a higher plating performance, it may be better plated with a metal material and hence forms the first conductive layer 120. Of course, other material with a higher plating performance also may be taken as the substrate. By utilizing the better plating performance, the first conductive layer 120 is directly plated on the surface of the glass substrate 110. The metal material is a common metal material with good conductivity, for example, copper, aluminum, silver, etc. The patterns of the first conductive pattern area 122 and the second conductive pattern area 142 may be strip-shaped, diamond-shaped or other shapes. The metal grid may be in regular geometric shape arranged based on a certain cycle, such as a regular polygon, a rectangle and a parallelogram, and so on; and it also may be irregular shapes arranged randomly. The insulating adhesive layer 130 may be a UV curable adhesive.

In this embodiment, the thickness of the second conductive layer 140 is not larger than the depth of the second groove 1342. The ratio of the depth of the second groove 1342 to the width of the second groove 1342 is larger than 1. The second groove 1342 is formed on the insulating adhesive layer 130 via imprinting, and it is imprinted through an imprinted template with a preset shape to obtain a needed pattern. After the second groove 1342 is filled with the metal material, the second conductive pattern area 142 with a preset shape is formed, thus simplifying the process and lowering the cost. When the thickness of the second conductive layer 140 is smaller than or equal to the depth of the second groove 1342, the plurality of the second conductive pattern areas 142 may also be insulated from each other, thus not only reducing the quantity of the metal material and lowering the cost but also reducing the thickness of the second conductive layer 140 and, hence, improving the light transmittance of the touch screen.

In this embodiment, when projected on the second conductive pattern area 142, the first conductive pattern area 122 is intersected with the second conductive pattern area 142. That is, the patterns of the first conductive pattern area 122 and the second conductive pattern area 142 are not overlapped, thus avoiding Moire fringes to be produced.

In this embodiment, the thickness of a grid wire of the metal grid of the first conductive pattern area 122 is within a range of 10-50 nm. As the first conductive layer 120 is formed on the surface of the glass substrate 110 directly by plating, the thickness of the grid wire of the formed metal grid is within a range of 10-50 nm, thus not only increasing the transparence of the first conductive pattern area 122 but also guaranteeing the first conductive pattern area 122 to have relatively good conductivity performance. The width of the grid wire of the metal grid of the second conductive pattern area 142 is within a range of 500 nm-5 µm. After the second groove 1342 is filled with the metal, the second conductive layer 140 is sintered and formed. The width of the grid wire of the metal grid of the second conductive pattern area 142 is within a range of 500 nm-5 µm, thus not only guaranteeing the metal grid of the second conductive pattern area 142 to be visually transparent but also increasing the conductive ability of the second conductive layer 140. The second conductive layer 140 is a driving electrode in a touch screen.

In this embodiment, the metal wire of the first conductive pattern area 122 is a transparent wire, and the light transmittance of the first conductive pattern area is more than 80%. The transparence of the touch screen is improved and hence user experience is improved.

Figure 2:
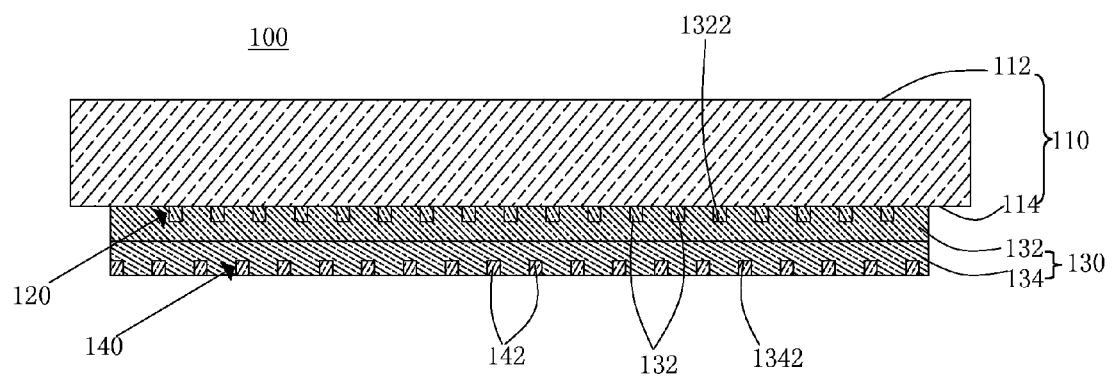
FIG. 2 is a schematic structural diagram of a touch screen of another embodiment.

Refer to FIG. 2, in other embodiments, the insulating adhesive layer 130 includes a first insulating adhesive layer 132 and a second insulating adhesive layer 134 in sequence along a direction away from the first surface 112. The first groove 1322 is provided on one side of the first insulating adhesive layer 132 close to the first surface 112. The second groove 1342 is provided on one side of the second insulating adhesive layer 134 away from the first surface 112. That is, the insulating adhesive layer 130, includes two the insulating adhesive layers in sequence along a direction away from the first surface 112. The objective of the arrangement is to prevent the insulating adhesive layer from being excessively imprinted during the process of forming the second groove 1342 thereon via imprinting, while the thickness of the insulating adhesive layer 130 is too small so that the second groove 1342 and the first groove 1322 are connected and the first conductive layer 120 and the second conductive layer 140 become in electrical connection, thus causing the problem during the use of the touch screen. When one insulating adhesive layer is thick enough, of course, there can be arranged only one insulating adhesive layer, thus avoiding the electrical connection between the first conductive layer 120 and the second conductive layer 140. The second insulating adhesive layer is directly plated on the surface of the first insulating adhesive layer, thus omitting the adhesive layer, simplifying operation and lowering the cost.

Figure 3:
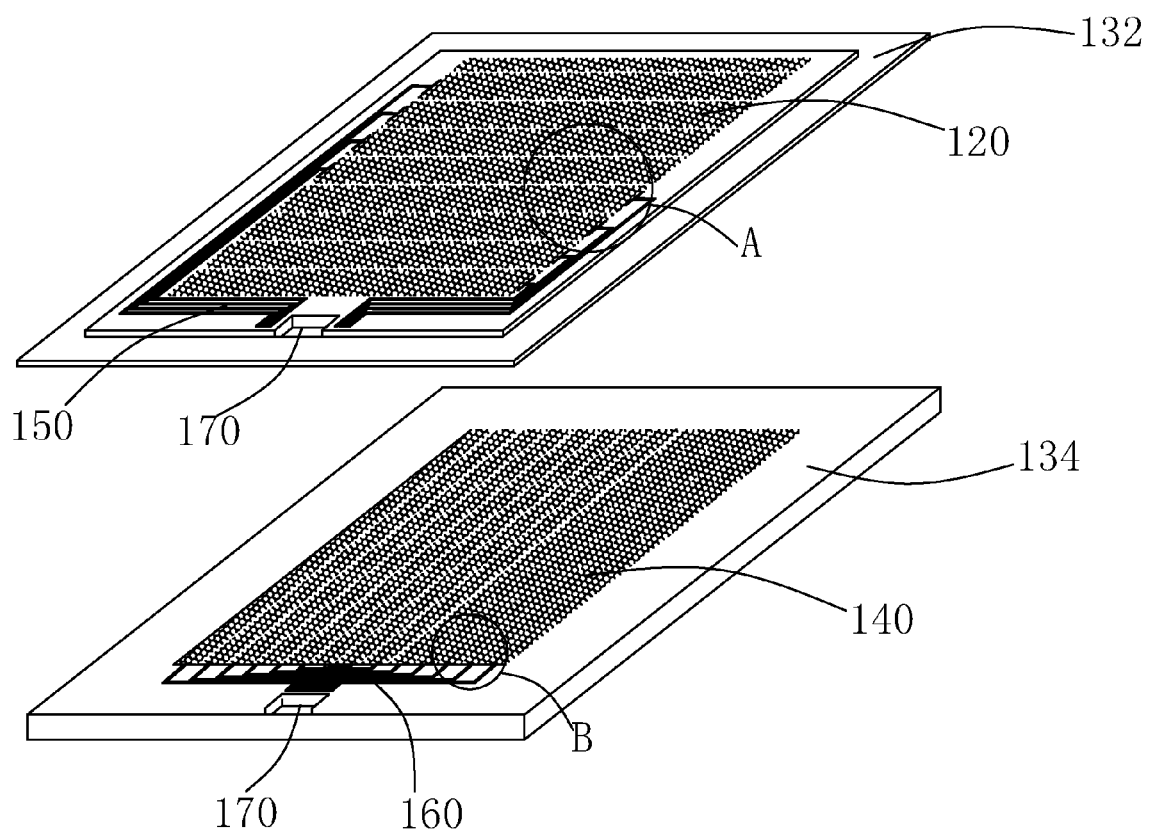
FIG. 3 is a schematic structural diagram of a touch screen of another embodiment.
Figure 3A:
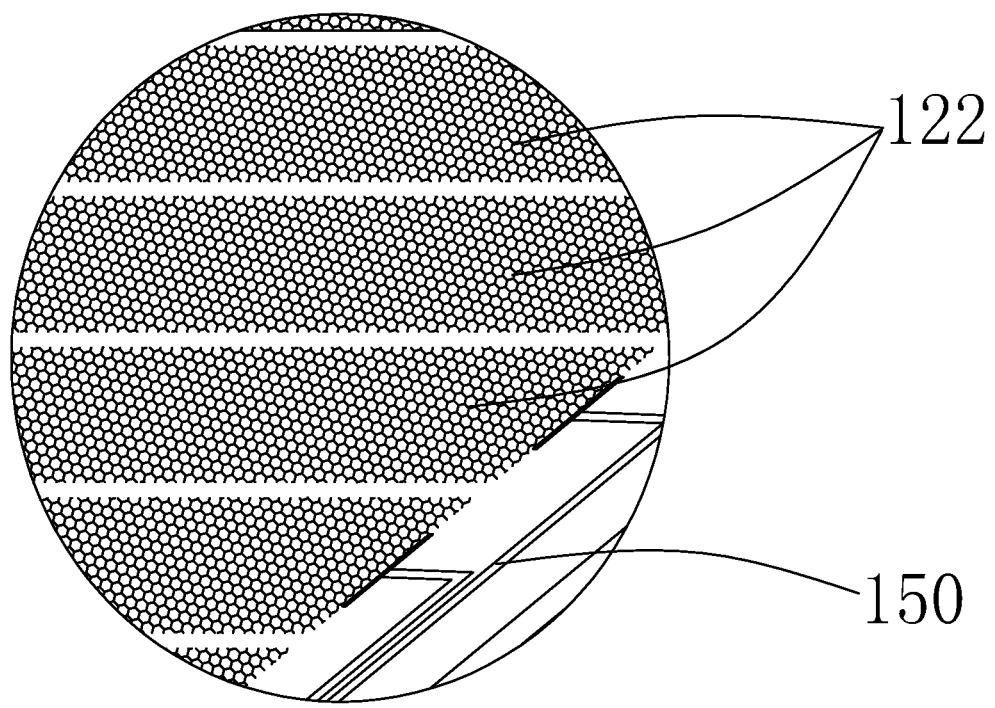
FIG. 3A is a partial schematic diagram of A in FIG. 3.
Figure 3B:
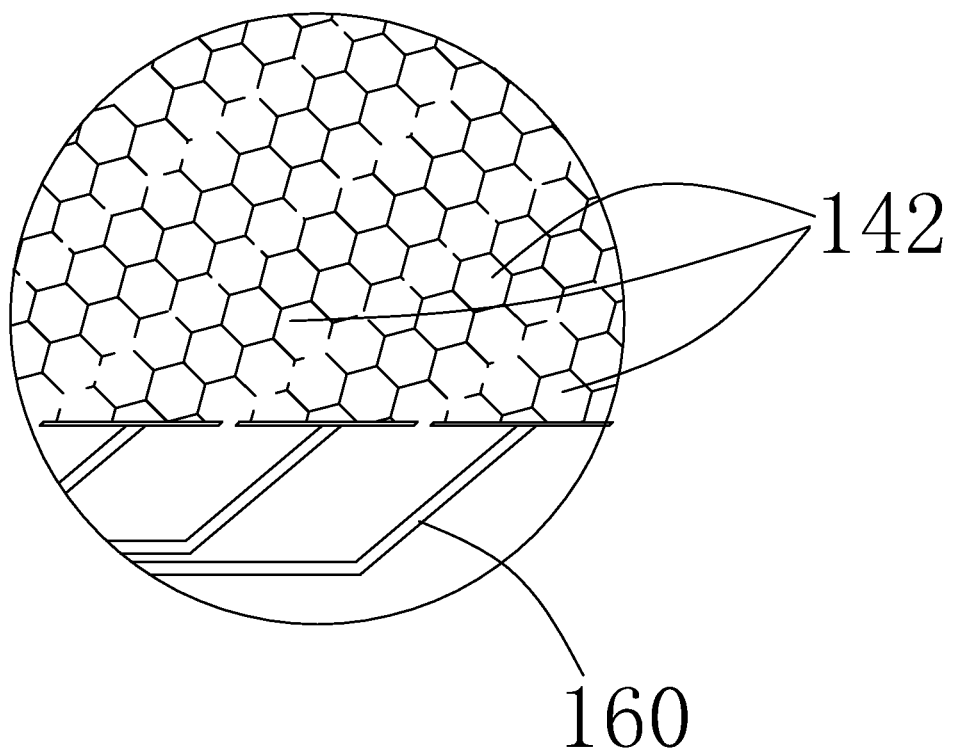
FIG. 3B is a partial schematic diagram of B in FIG. 3.

Please refer to FIGS. 3, 3A and 3B, in the embodiment of FIG. 2, the touch screen also includes a first lead wire 150 and a second lead wire 160. The first lead wire 150 is attached to the first surface 112. One end of the first lead wire 150 is electrically connected with the first conductive pattern area 122. The second lead wire 160 is embedded on one side of the insulating adhesive layer 130 away from the glass substrate 110. One end of the second lead wire 160 is electrically connected with the second conductive pattern area 141. The other end of the first insulating adhesive layer 132 is provided with a cutout 170 at a portion thereof which aligns with the other end of the first lead wire 150. Through the cutout 170, the other end of the first lead wire 150 is exposed to the same side of the second insulating adhesive layer 134, to which the other end of the second lead wire 160 is also exposed, so as to be connected with a Flexible Printed Circuit Board (FPCB). Please refer to FIG. 3A, the end of the first lead wire 150 is at least electrically connected with two metal wires of the first conductive pattern area 122. The end of the second lead wire 160 is at least electrically connected with two the metal wires of the second conductive pattern area 142. The first lead wire 150 and the second 160 may be solid wires and also may be grid structures. The grid structure may be a regular grid and may also be a random grid. A cutout 170 is formed on the first insulating adhesive layer 132 and hence the free end of the first lead wire 150 is exposed. Therefore, the free end of the first lead wire 150 on the glass substrate 110 and that of the second lead wire 160 on the second insulating adhesive 134 are connected with FPCB at the same time, thus simplifying the structure of FPCBA and lowering the cost.

Figure 4:
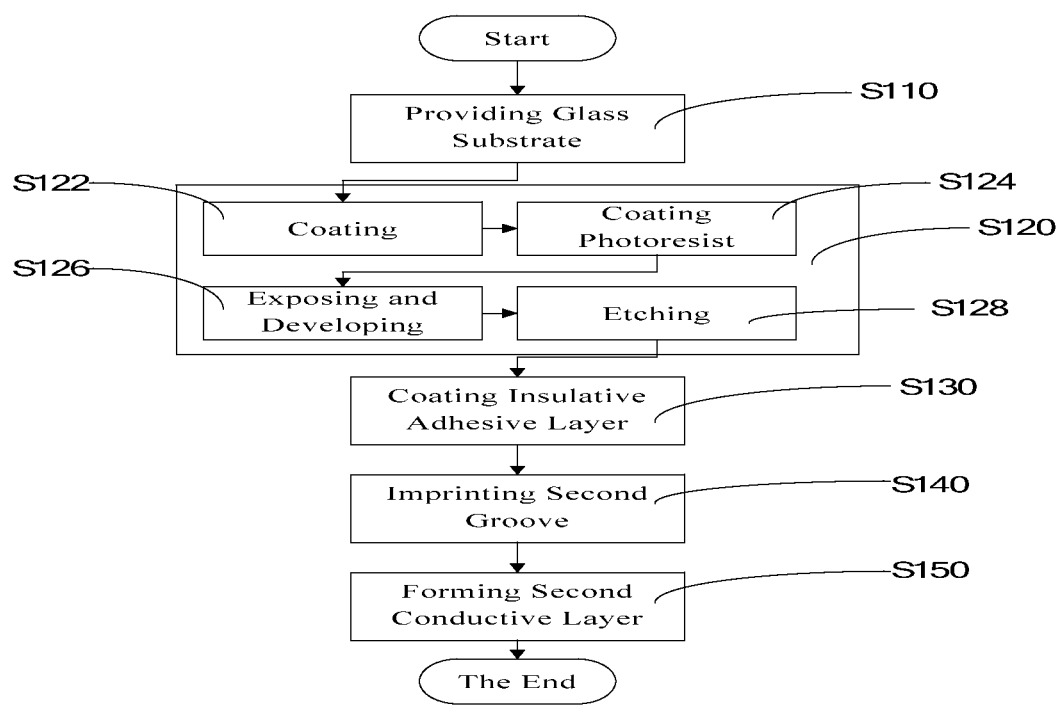
FIG. 4 is a flow chart of producing a touch screen in FIG. 1.

See FIGS. 1 and 4, A method of producing a touch screen includes the following steps:

In Step S110, providing a glass substrate 110, where the glass substrate 110 includes a first surface 112 and a second surface 114 which are arranged oppositely. The glass substrate 110 may be an inorganic glass panel, for example a soda-lime glass panel or an aluminosilicate glass panel. As the inorganic glass has relatively high plating performance, it may be better plated with a metal material and hence forms the first conductive layer 120. Of course, other material with a relatively high plating performance also may be taken as the substrate.

In Step S120, forming a first conductive layer 120, where the first conductive layer 120 is directly formed on the first surface 112 and has a plurality of first conductive pattern areas 122; the first conductive pattern area 122 includes a metal grid consisting of a plurality of crossed metal wires; and the plurality of the first conductive pattern areas 122 are insulated from each other.

In this embodiment, in Step S120, forming the first conductive layer 120 particularly includes the following steps:

In Step S122, plating, where the metal with a relatively good conductivity is plated on the first surface 112 of the glass substrate and forms a metal plating layer; through electroless plating, electroplating, vacuum sputtering or evaporation, one layer of the metal is plated on the first surface 112 of the glass substrate and forms a metal plating layer; and the metal is the metal with a relatively good conductivity, for example, silver, copper, etc.

In Step S124, coating a photoresist, where the photoresist is coated on the surface of the metal plating layer; one layer of the photoresist is coated on the surface of the metal plating layer, so that all of the metal plating layer is covered with the photoresist.

In Step S126, exposing and developing, where the photoresist is exposed and developed to form a plurality of the first conductive pattern areas 122; the first conductive pattern area 122 includes a metal grid consisting of a plurality of crossed metal wires; the thickness of the grid wire of the metal grid is within a range of 10-50 nm; the metal grid may be regular geometric shapes arranged based on a certain cycle, such as a regular polygon, a rectangle and a parallelogram, and so on; and it also may be irregular shapes arranged randomly. The photoresist is developed through a baffle plate with a preset shape; the photoresist at an exposed area is reacted; its solubility, affinity and so on are obviously changed; and it is then developed. In this embodiment, the preset shape is a strip shape. In other embodiments, it also may be diamond or other shapes. During a developing process, the part which is not exposed is reacted with a developed liquid, and forms a plurality of the first conductive pattern areas 122.

In Step S128, etching, wherein the metal grid except the first conductive pattern area 122 is eliminated to form the first conductive layer 120 with a plurality of the first conductive pattern areas 122; the first conductive pattern area 122 includes a metal grid consisting of a plurality of crossed metal wires; a plurality of the first conductive pattern areas 122 are insulated from each other; the metal grid except the first conductive pattern area is etched with acid solutions, for example, HCl, HNO$_3$ or other mixed solutions, so as to eliminate the unexposed metal grid, and form the first conductive layer 120 with a plurality of the first conductive pattern areas 122 insulated from each other; and the thickness of a grid wire of the metal grid of the first conductive pattern area is within a range of 10-50 nm.

In Step S130, coating the insulating adhesive layer 130, where the insulating adhesive layer 130 is coated on the first surface 112; a first groove 1322, matched with the first conductive pattern area 122, is formed on one side of the insulating adhesive layer 130 close to the first surface 112; and the first conductive pattern area 122 is received in the first groove 1322. In this embodiment, before the insulating adhesive layer 130 is coated, the Step 130 also may include the step in which the adhesive residue of the photoresist is eliminated, thus greatly increasing the light transmittance of the first conductive layer 120; the material of the insulating adhesive layer 130 is a transparent insulating material, for example, PET. When the insulating adhesive layer 130 is coated on the first surface 112, as the first conductive layer 120 is formed on the first surface 112, the insulating adhesive layer 130 forms a first groove 1322 matched with the first conductive pattern area 122, and the first conductive pattern area 122 is received in the first groove 1322, when the insulating adhesive layer 130 is coated.

In Step S140, imprinting a second groove 1342, where one side of the insulating adhesive layer 130 away from the first surface 112 is imprinted with the second groove 1342 with a preset shape. After the insulating adhesive layer 130 is cured, one side of the insulating adhesive layer 130 away from the first surface 112 is imprinted with an imprinting module. Therefore, one side of the insulating adhesive layer 130 far away from the first surface 112, forms a second groove 1342 with a preset shape. The second groove 1342 is used for being filled with a metal material to form a second conductive layer 140.

In Step S150, forming a second conductive layer 140, where the conductive material is firstly filled in the second groove 1342, sintered and cured, thus forming the second conductive layer 140 with a plurality of second conductive pattern areas 142; the second conductive pattern area 142 is received in the second groove 1342; the second conductive pattern area 142 includes a conductive grid consisting of a plurality of crossed conductive wires; the plurality of the second conductive pattern areas 142 are insulated from each other; the second groove 1342 is filled with the conductive material (for example, conductive silver paste or ITO) and sintered under the temperature of 170° C. The width of the grid wire of the conductive grid formed after being sintered is within a range of 500 nm-5 μm. As the conductive grid of the second conductive pattern area 142 is received in the second groove 1342, the plurality of the second conductive pattern areas 142 are insulated from each other.

In the method of producing a touch screen, the first conductive layer 120 and the second conductive layer 140 adopt different molding methods. The first conductive layer 120 is directly formed on the first surface 112 through plating by utilizing the relatively good plating performance of the glass substrate. The second conductive layer 140 is formed through imprinting the second groove 1342 in the insulating adhesive layer 130 directly, filling the second groove 1342 with the conductive material, as well as sintering and curing, thus having operation is simple and cost is relatively low. Meanwhile, the touch screen may be guaranteed to have relatively low sheet resistance, relatively high light transmittance and relatively small thickness.

Here, as a plurality of second conductive pattern areas 142 of the second conductive layer 140 form the second grooves 1342 at a time through graphical imprinting, and then the second grooves 1342 are filled with the conductive material to form the second conductive pattern areas, each piece of the conductive patterns is not needed to be graphically etched, thus greatly simplifying the processes. Even when the second groove 1342 is filled with an ITO material, a large quantity of the conductive material may also be saved, thus lowering the cost. Therefore, the second groove 1342 may be filled with not only the ITO material but also metal materials (such as silver, copper, etc.), and forms the second conductive layer 140.

Figure 5:
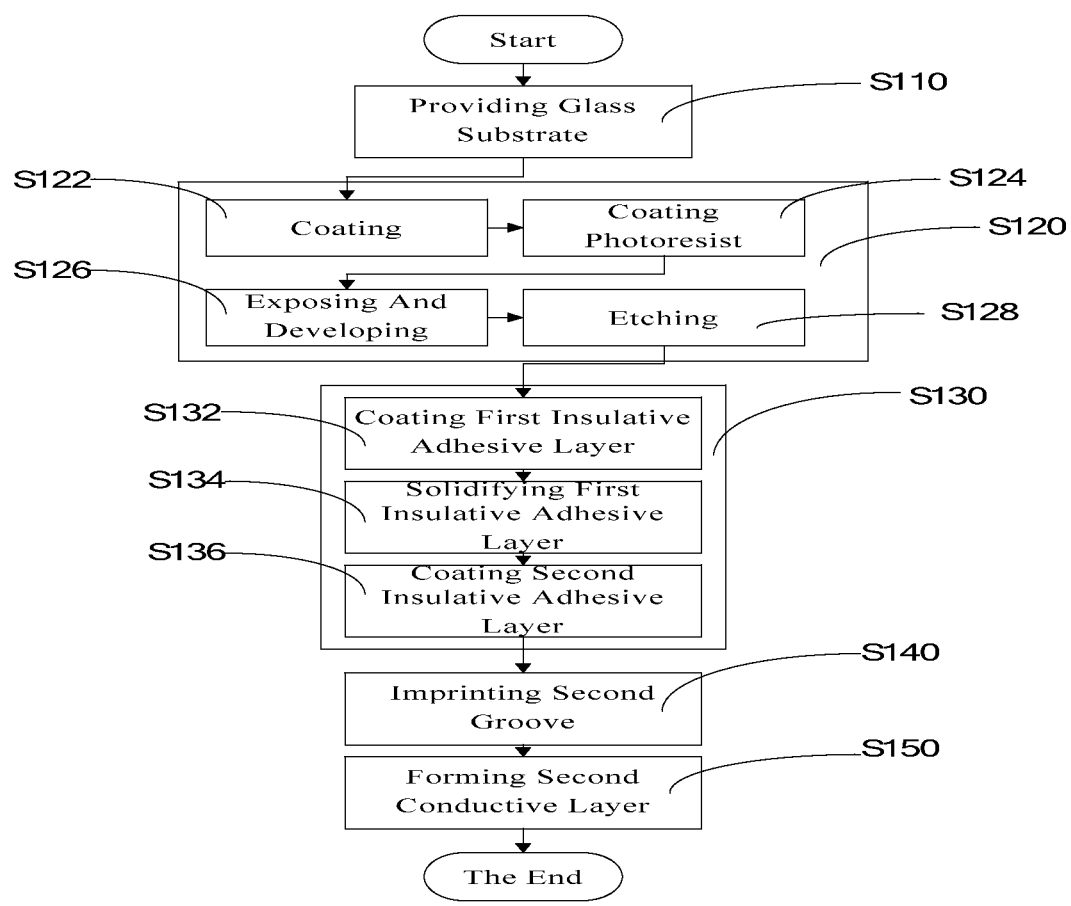
FIG. 5 is a flow chart of producing a touch screen in FIG. 2.

See FIGS. 2 and 5, in other embodiments, in Step S130, the coating of the insulating adhesive layer also includes the following steps:

In Step S132, coating a first insulating adhesive layer 132, where the first groove 1322, matched with the first conductive pattern area 122, is formed on one side of the first insulating adhesive layer 132 close to the first surface; and the first conductive pattern area 122 is received in the first groove 1322. The first surface 112 of the glass substrate is coated with the first insulating adhesive layer 132, so that the first insulating adhesive layer 132 is attached to the first surface 112. As the first conductive layer 120 is firstly formed on the first surface 112, after the first insulating adhesive layer 132 is coated, a first groove 1322 is formed on one side of the first insulating adhesive layer 132 close to the first surface 112. The first groove 1322 and the first conductive pattern area 122 are matched with each other. The first conductive pattern area 122 is received in the first groove 1322.

In Step S134, curing the first insulating adhesive layer 132, where the first insulating adhesive layer 132 is cured with a pre-roasting manner or a heating manner.

In Step S136, coating the second insulating adhesive layer 134, where the first cured insulating adhesive layer 132 is coated again so as to form the second insulating adhesive layer 134. The material of the second insulating adhesive layer 134 and that of the first insulating adhesive 132 are the same.

The above method of forming two insulating adhesive layers may prevent an imprinting mould from excessively imprinting, excessive imprinting may cause the first groove 1322 and the second groove 1342 to be connected, and thus the first conductive layer 120 and the second conductive layer 140 become electrically connected. It should be noted that, when only one layer of the insulating adhesive layer is coated, and when the insulating adhesive layer is thick enough, excessive imprinting by the imprinting mould can be avoided. Therefore, it is not necessary to adopt the production process of coating two insulating adhesive layers.

The above embodiments merely describe several implementing modes of the invention with specific details, but should not be understood as limiting the scope of the invention. It shall be noted that: persons skilled in the prior art, without departing from the concept of the invention, also may make modifications and improvements, which all belong to the protection scope of the invention. Therefore, the protection scope of the invention shall be defined by the appended claims.

What is claimed is:

1. A touch screen, comprising:
    a glass substrate, comprising a first surface and a second surface arranged opposite to the first surface, wherein the first surface is attached with a first conductive layer; the first conductive layer comprises a plurality of first conductive pattern areas; each of the first conductive pattern area comprises a metal grid consisting of a plurality of crossed metal wires; the first conductive pattern area is a metal plating layer attached to the first surface of the glass substrate through graphical etching; and the plurality of the first conductive pattern areas are insulated from each other;
    an insulating adhesive layer, attached on the first surface, wherein a first groove, matched with the first conductive pattern area, is formed on one side of the insulating adhesive layer close to the first surface; the first conductive pattern area is received in the first groove; one side of the insulating adhesive layer away from the first surface, is provided with a second groove with a preset shape; and the second groove is formed through graphical imprinting and a depth to width ratio of the second groove is larger than 1; and
    a second conductive layer, comprising a plurality of second conductive pattern areas, wherein the second conductive pattern area comprises a conductive grid consisting of a plurality of crossed conductive wires; a conductive material is filled in the second groove and cured, thus forming the conductive grid of the second conductive pattern area; and a plurality of the second conductive pattern areas are insulated from each other;
    wherein, a projection of the first conductive pattern area, which is projected on a surface of the second conductive pattern area, is intersected with the second conductive pattern area,
    wherein the insulating adhesive layer comprises a first insulating adhesive layer and a second insulating adhesive layer in sequence along a direction away from the first surface; the first groove is formed on one side of the first insulating adhesive layer close to the first surface; and the second groove is provided on one side of the second insulating adhesive layer away from the first surface, and
    further comprising a cutout, a first lead wire and a second lead wire; wherein the first lead wire is attached to the first surface of the glass substrate; one end of the first lead wire is electrically connected with the first conductive pattern area; the second lead wire is embedded in one side of the second insulating adhesive layer far away from the glass substrate; one end of the second lead wire is electrically connected with the second conductive pattern area; the cutout is provided at one end of the first insulating adhesive layer, which aligns with the other end of the first lead wire; the cutout cuts through the first insulating adhesive layer and the second insulating adhesive layer; the other end of the first lead wire and the other end of the second leading wire are exposed to the same side of the second insulating adhesive layer through the cutout.

2. The touch screen according to claim 1, wherein a thickness of the second conductive layer is not larger than a depth of the second groove.

3. The touch screen according to claim 1, wherein the thickness of a grid wire of the metal grid of the first conductive pattern area is within a range of 10-50 nm.

4. The touch screen according to claim 3, wherein a metal wire of the first conductive pattern area is a transparent wire, and the light transmittance of the first conductive pattern area is more than 80%.

5. The touch screen according to claim 1, wherein the width of the grid wire of the metal grid of the second conductive pattern area is within a range of 500 nm-5 μm.

6. The touch screen according to claim 1, wherein the glass substrate is made of soda-lime glass or aluminosilicate glass.

7. A method of producing a touch screen, comprising the following steps:
    providing a glass substrate, wherein the glass substrate comprises a first surface and a second surface which are arranged oppositely;
    forming a first conductive layer, wherein the first conductive layer is directly formed on the first surface and has a plurality of first conductive pattern areas; the first conductive pattern area comprises a metal grid consisting of a plurality of crossed metal wires; and the plurality of the first conductive pattern areas are insulated from each other;
    coating an insulating adhesive layer, wherein the insulating adhesive layer is coated on the first surface, a first groove, matched with the first conductive pattern area, is formed on one side of the insulating adhesive layer close to the first surface; and the first conductive pattern area is received in the first groove;
    imprinting a second groove, wherein the second groove is imprinted in one side of the insulating adhesive layer with a preset shape, the one side is far away from the first surface, and a depth to width ratio of the second groove is larger than 1;

forming a second conductive layer, wherein a conductive material is filled in the second groove and cured, thus forming a second conductive layer with a plurality of second conductive pattern areas; the second conductive pattern area comprises a conductive grid formed by a conductive wire; the conductive grid is received in the second groove; the plurality of the second conductive pattern areas are insulated from each other; and a projection of the first conductive pattern area, which is projected on the surface of the second conductive pattern area, is intersected with the second conductive pattern area, wherein coating the insulating adhesive layer comprises the following steps:

coating a first insulating adhesive layer, wherein the first groove, matched with the first conductive pattern area, is formed on one side of the first insulating adhesive layer close to the first surface; and the first conductive pattern area is received in the first groove;

curing the first insulating adhesive layer;

coating a second insulating adhesive layer, wherein the second groove, matched with the second conductive pattern area, is formed on one side of the second insulating adhesive layer away from the first surface, and forming a cutout, a first lead wire and a second lead wire; wherein the first lead wire is attached to the first surface of the glass substrate; one end of the first lead wire is electrically connected with the first conductive pattern area; the second lead wire is embedded in one side of the second insulating adhesive layer far away from the glass substrate; one end of the second lead wire is electrically connected with the second conductive pattern area; the cutout is provided at one end of the first insulating adhesive layer, which aligns with the other end of the first lead wire; the cutout cuts through the first insulating adhesive layer and the second insulating adhesive layer; the other end of the first lead wire and the other end of the second leading wire are exposed to the same side of the second insulating adhesive layer through the cutout.

8. The method of producing a touch screen according to claim 7, wherein forming the first conductive layer particularly comprises the following steps:

plating, wherein a conductive metal plating layer is formed on the first surface of the glass substrate through electroless plating, electroplating, vacuum sputtering or evaporation;

coating a photoresist, wherein the photoresist is coated on the surface of the metal plating layer;

exposing and developing, wherein the photoresist is exposed and developed to facilitate a photoresist layer to form a plurality of the first conductive pattern areas; etching, wherein the exposed part of the metal plating layer except the first conductive pattern area is eliminated to form the first conductive layer with a plurality of the first conductive pattern areas; the first conductive pattern area comprises a metal grid consisting of a plurality of crossed metal wires; and the plurality of the first conductive pattern areas are insulated from each other.

9. The method of producing a touch screen according to claim 7, wherein the glass substrate is made of soda-lime glass or aluminosilicate glass.

* * * * *